United States Patent
Liu et al.

(10) Patent No.: US 8,531,861 B2
(45) Date of Patent: Sep. 10, 2013

(54) ONE TIME PROGRAMMING MEMORY AND METHOD OF STORAGE AND MANUFACTURE OF THE SAME

(75) Inventors: Ming Liu, Beijing (CN); Qingyun Zuo, Beijing (CN); Shibing Long, Beijing (CN); Changqing Xie, Beijing (CN); Zongliang Huo, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 119 days.

(21) Appl. No.: 13/223,165

(22) Filed: Aug. 31, 2011

(65) Prior Publication Data
US 2012/0140543 A1    Jun. 7, 2012

(30) Foreign Application Priority Data

Dec. 2, 2010   (CN) .......................... 2010 1 0570529

(51) Int. Cl.
*G11C 17/00* (2006.01)
(52) U.S. Cl.
USPC ........... 365/100; 365/148; 365/175; 365/177; 365/225.6; 365/243
(58) Field of Classification Search
USPC ............... 365/100, 148, 175, 177, 243, 225.6
See application file for complete search history.

(56) References Cited

U.S. PATENT DOCUMENTS

| | | | |
|---|---|---|---|
| 8,125,818 B2 * | 2/2012 | Muraoka et al. | 365/148 |
| 2009/0027938 A1 * | 1/2009 | Wells | 365/51 |
| 2010/0112774 A1 * | 5/2010 | Oh et al. | 438/382 |
| 2010/0238709 A1 * | 9/2010 | Eun et al. | 365/148 |
| 2011/0037043 A1 * | 2/2011 | Wada | 257/2 |

* cited by examiner

*Primary Examiner* — Pho M Luu
(74) *Attorney, Agent, or Firm* — Martine Penilla Group, LLP

(57) ABSTRACT

One time programming memory and methods of storage and manufacture of the same are provided. Examples relate to microelectronic memory technology and manufacture. The one time programming memory includes a diode (10) having a unidirectional conducting rectification characteristic and a variable-resistance memory (20) having a bipolar conversion characteristic. The diode (10) having the unidirectional conducting rectification characteristic and the variable-resistance memory (20) having the bipolar conversion characteristic are connected in series. The one time programming memory device of this example takes the bipolar variable-resistance memory (20) as a storage unit, programming the bipolar variable-resistance memory (20) into different resistance states so as to carry out multilevel storage, and takes the unidirectional conducting rectification diode (10) as a gating unit. The rectification characteristic of unidirectional conducting rectification diode (10) can not only enable the bipolar variable-resistance storage (20) to be programmed only once but also inhibit crosstalk in a cross-array structure.

13 Claims, 4 Drawing Sheets

US 8,531,861 B2

ONE TIME PROGRAMMING MEMORY AND METHOD OF STORAGE AND MANUFACTURE OF THE SAME

CLAIM OF PRIORITY

This application claims priority under 35 U.S.C. §119 to Chinese Application No. CN201010570529.9, filed Dec. 2, 2010, the entire contents of which are incorporated herein by reference in their entirety.

FIELD OF THE INVENTION

The present invention relates to a memory and method of storage and manufacture of the same, and in particular relates to a one time programming memory and its multilevel storage method. It belongs to the memory and microelectronic manufacture technical field.

BACKGROUND OF THE INVENTION

At present, an upsurge of research on new types of memories rises in the world. There are a great variety of new types of memories. Their mechanisms are different. It is unclear which one can find favor with integrated circuit manufacturers and customers. However, one thing is for sure: in case where performance is assured, to improve the storage density makes the cost of storage of each bit of data lower and its market competence stronger. To a large extent, it determines whether the new type of memory can be used finally. Generally speaking, there are two effective methods that can improve the density of memories. One is to reduce cell area with the aid of processes or design of device structures. For example, a cross-array structure can achieve the theoretical minimum cell area. The other effective measure is to use the multilevel storage unit. It dramatically improves the storage density and reduces the cost of the area per bit without enlargement of the storage area. Its actual application has a preferable market prospect. Currently, various international corporations and research institutes are actively researching on memory technologies based on the cross-array structure and the multilevel storage unit so that they can occupy a leading position in the competitive market in the future.

One time programming memory is very important and widely applied to, for example, storage of permanent materials, storage of codes, calibration tables, setting of parameters, which usually will not be changed once being programmed, because of the advantages of simple structure and low power consumption. The keys of the one time programming memory are low cost, high storage density, low power consumption and quick reading speed. Among the current one time programming storage technologies, the one time programming memory using cross-array can achieve the higher storage density. However, among this kind of one time programming memory technologies using the cross-array integration, the used principle is always to carry out programming in accordance with the state of dielectric (being punctured or not), so such a kind of one time programming memory generally only has two states: "0" and "1", but it cannot realize multilevel storage.

SUMMARY OF THE INVENTION

In order to improve the integration density of the prior one time programming memory and reduce the cost, the present invention provides a one time programming memory and method of storage and manufacture of the same.

The technical solution of the present invention to solve the aforesaid technical problem are as follows: a one time programming memory comprises a variable-resistance memory having a bipolar conversion characteristic and a diode having a unidirectional conducting rectification characteristic. The variable-resistance memory having the bipolar conversion characteristic is connected in series with the diode having the unidirectional conducting rectification characteristic. The rectification diode, by means of the unidirectional conducting characteristic, enables the bipolar variable-resistance memory to carry out one time programming. Besides, the bipolar variable-resistance memory carries out one time programming memory programming in different states into the different states via different voltages or currents to realize the multilevel storage.

Furthermore, the diode having the unidirectional conducting rectification characteristic comprises a lower electrode, a diode functional layer and an intermediate electrode. The diode functional layer is located between the lower electrode and the intermediate electrode. The diode having the rectification characteristic is a Schottky or PN junction diode.

Moreover, the functional layer of the Schottky diode is formed by at least one of the following materials or the material formed by doping and modifying at least one of the following materials: NiO, $TiO_x$, $CuO_x$, $ZrO_x$, $TaO_x$, $AlO_x$, CoO, $HfO_x$, ZnO, Si and organic materials.

Furthermore, P-type and N-type material layers in the functional layer of the PN junction diode are formed by at least one of the following materials or the material formed by doping and modifying at least one of the following materials: NiO, $TiO_x$, $CuO_x$, $ZrO_x$, $TaO_x$, $AlO_x$, CoO, $HfO_x$, ZnO, $InZnO_x$, Si and organic materials.

Furthermore, the variable-resistance memory having the bipolar conversion characteristic comprises an upper electrode, a variable-resistance storage layer and an intermediate electrode. The variable-resistance storage layer is located between the upper electrode and the intermediate electrode.

Furthermore, the upper electrode, the intermediate electrode and the lower electrode are formed by at least one of the following materials: Pt, Ag, Pd, W, Ti, Al, Cu, TiN, ITO, IZO, YBCO, $LaAlO_3$, $SrRuO_3$ and polycrystalline silicon.

Furthermore, the variable-resistance storage layer is formed by at least one of the following materials or the material formed by doping and modifying at least one of the following materials NiO, $TiO_x$, $CuO_x$, $ZrO_x$, $TaO_x$, $AlO_x$, CoO, $HfO_x$, $MoO_x$, ZnO, PCMO, LCMO, $SrTiO_3$, $BaTiO_3$, $SrZrO_3$, amorphous silicon and organic materials.

The present invention further provides a technical solution to solve the aforesaid technical problem: a storage method of a one time programming memory. The one time programming memory comprises a diode having a unidirectional conducting rectification characteristic and a variable-resistance memory having a bipolar conversion characteristic. The variable-resistance memory having the bipolar conversion characteristic is connected in series with the rectification diode having the unidirectional conducting characteristic. Said method includes: a suitable programming voltage or programming current is applied so that the bipolar conversion variable-resistance memory of which the primary state is in high resistance is converted from high resistance to low resistance. Because of the rectification function of the diode, the resistance of the variable-resistance memory having the bipolar conversion characteristic is not varied at the opposite polar voltage so that it is always in a low resistance state to achieve one time programming.

Furthermore, when the programming voltages or the programming currents are different, the bipolar variable-resistance memory can be programmed into different states so as to realize multilevel storage.

Furthermore, the polarity of the programming voltage or the direction of the programming current is consistent with the positive voltage polarity or the positive current direction of the diode.

Furthermore, when the one time programming variable-resistance memory is in the low resistance state, the rectification function of the diode can inhibit read crosstalk and avoid occurrence of misreading.

The present invention further provides a technical solution to solve the technical problem: a manufacture method of a one time programming memory comprises the following steps:

step 10: forming a diode having a unidirectional conducting rectification characteristic on a substrate;

step 20: forming a variable-resistance memory having a bipolar conversion characteristic on the diode having the unidirectional conducting rectification characteristic.

Furthermore, the step 10 comprises the following steps:

step 101: forming a lower electrode on the substrate;

step 102: forming a diode functional layer on the lower electrode;

step 103: forming an intermediate electrode on the diode functional layer.

Furthermore, the step 20 comprises the following steps:

step 202: forming a variable-resistance storage layer on the intermediate electrode;

step 203: forming an upper electrode on the variable-resistance storage layer.

The sequence of step 10 and step 20 in the manufacture method of a one time programming memory provided by the present invention is changeable. That is to say, step 10 can be prior to step 20 or subsequent to step 20, as long as the variable-resistance memory having the bipolar conversion characteristic is connected in series with the diode having a unidirectional conducting rectification characteristic.

In the present invention, we connect the rectification diode having the unidirectional conducting characteristic and the variable-resistance memory having the bipolar conversion characteristic in series to form a one time programming memory having the multilevel storage characteristic.

The present invention introduces the characteristic of variable-resistance memory that can carry out the multilevel storage into the one time programming memory and connects the unidirectional conducting rectification diode with the bipolar variable-resistance memory in series to implement programming only once, so as to realize the one time programming memory device having multilevel storage capacity.

Use of the present invention can carry out one time programming and realize multilevel storage, which can dramatically improve the storage density of the one time programming memory and reduce the cost. It is beneficial to application of one time programming memory.

In summary, the beneficial effect of the present invention is: the one time programming memory of the present invention takes the diode having the unidirectional conducting rectification characteristic as a gating unit and the variable-resistance memory having the bipolar conversion characteristic as a storage unit. In addition, the two are connected together in series. The structures are simple. They are easily integrated. The density is high. The cost is low. Moreover, the device has a rectification function in the low resistance state, which can inhibit the read crosstalk phenomenon in the cross-array structure and avoid misreading. The one time programming memory of the present invention uses different programming voltages or the different programming currents to program the variable-resistance memory having the bipolar conversion characteristic into the different low resistance state to achieve the multilevel storage. The one time programming memory of the present invention is integrated by using the cross-array structure. It can realize the higher storage density.

DESCRIPTION OF FIGURES

The aforesaid and other features and advantages of the present invention will be clearer through the detailed description of the embodiments of the present invention with reference to the drawings, in the figures.

MODE OF CARRYING OUT THE INVENTION

The following contents in combination with the figures describe the principle and features of the present invention. The embodiments are only used to explain the present invention but not to limit the scope of the present invention.

Figure 1:
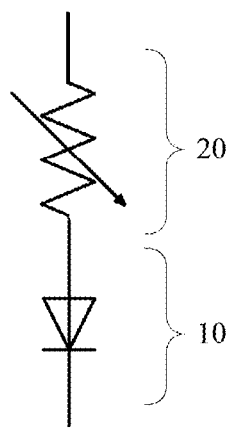
FIG. 1 is an equivalent diagram of a 1D1R memory circuit of the present invention.

FIG. 1 is an equivalent diagram of the circuit of a one time programming memory of the present invention. As illustrated in FIG. 1, the one time programming memory comprises a variable-resistance memory 20 having a bipolar conversion characteristic and a diode 10 having a unidirectional conducting rectification characteristic. The variable-resistance memory 20 having the bipolar conversion characteristic and the diode 10 having the unidirectional conducting rectification characteristic are connected in series.

Under the bias voltage, the resistance of the bipolar variable-resistance memory device 20 can be converted between high or low resistance states so as to carry out storage of "0" and "1", wherein the primary state is in high resistance. In addition, during the process in which the variable-resistance memory 20 is converted from the high resistance state to the low resistance state, use of different limited currents or use of different programming voltages can enable the variable-resistance memory to be programmed into the different resistance states to carry out multilevel storage.

Figure 2:
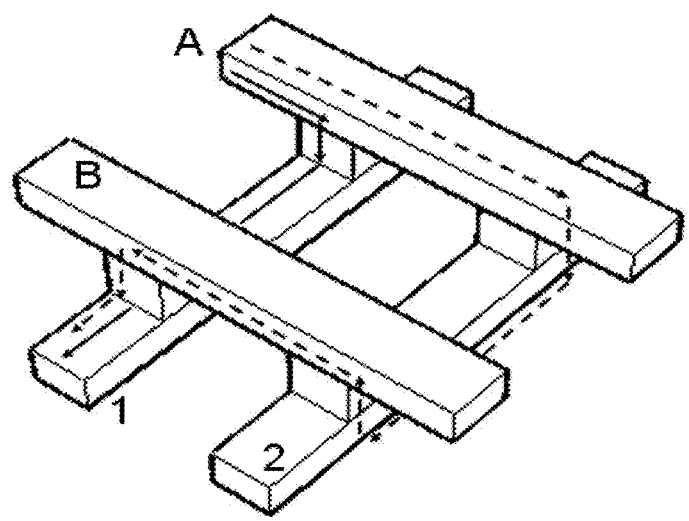
FIG. 2 is a read crosstalk diagram of the variable-resistance memory of the present invention having the bipolar conversion characteristic in a 2×2 cross-array structure in the ideal case.

The one time programming memory of the present invention is integrated by using a cross-array structure. As illustrated in FIG. 2, in the cross-array structure, there is a storage unit at an intersection of parallel wires (1, 2, A, B) that are vertical to each other up and down. Each storage unit can carry out gating of the device and can be read and written. However, as for the memory unit having an electrical characteristic of linear symmetry, there is a read crosstalk problem in the cross-array structure.

FIG. 2 shows four adjacent devices. If there is only one memory unit is in the high resistance state and the other ones are in the low resistance state, when the resistance value of the unit in the high resistance state is read, the desired current conduction path is shown by full lines in FIG. 2; however, the actual current conduction path is shown by dotted lines in FIG. 2. Thus, the readout resistance value is not the resistance of the unit in the high resistance state. This is the read crosstalk phenomenon which results in misreading.

One of the methods for solving the misreading is to enable the storage unit to possess a rectification characteristic. In the present invention, connecting the storage unit with a rectification diode in series is to form a unit structure comprising one diode and one resistor (1D1R) (as shown in FIG. 1). This can inhibit a leak current path shown by the dotted line in FIG. 2 to reduce misreading. That the common unidirectional conducting diode and the bipolar variable-resistance memory are connected in series in the present invention, such that the bipolar variable-resistance memory can be programmed only once on one hand, and that the rectification characteristic of the diode can inhibit the crosstalk in the cross array after it is programmed into the low resistance state on the other hand.

Figure 3:
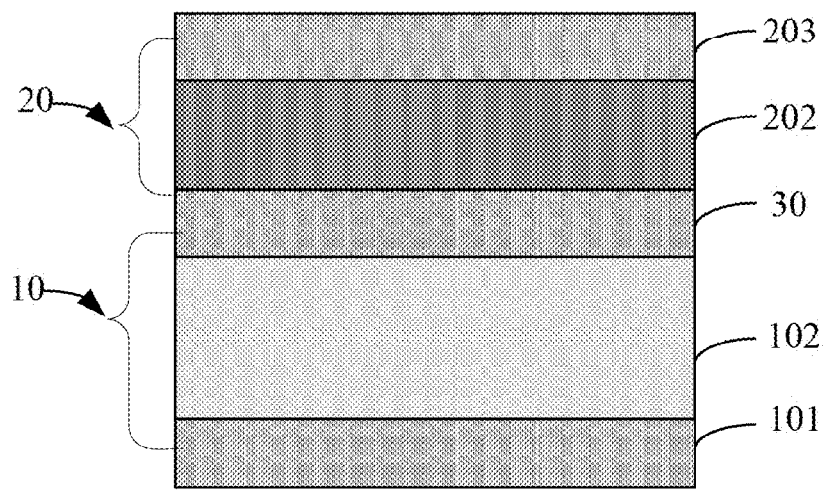
FIG. 3 is a structure diagram of the one time programming memory of the present invention.

FIG. 3 is a structure diagram of the one time programming memory of the present invention. As illustrated in FIG. 3, the diode 10 having the unidirectional conducting rectification characteristic comprises a lower electrode 101, a diode functional layer 102 and an intermediate electrode 30. The diode functional layer 102 is located between the lower electrode 101 and the intermediate electrode 30. The variable-resistance memory 20 having the bipolar conversion characteristic comprises an upper electrode 203, a resistance conversion storage layer 202 and an intermediate electrode 30. The resistance conversion storage layer 202 is located between the upper electrode 203 and the intermediate electrode 30.

The diode 10 having the unidirectional conducting rectification characteristic is a Schottky diode or a PN junction diode. The functional layer 102 of the Schottky diode is formed by at least one of the following materials or the material formed by doping and modifying at least one of the following materials: NiO, $TiO_x$, $CuO_x$, $ZrO_x$, $TaO_x$, $AlO_x$, CoO, $HfO_x$, ZnO, Si and organic materials. The P-type and N-type material layers in the functional layer 102 of the PN junction diode are formed by at least one of the following materials or the material formed by doping and modifying at least one of the following materials: NiO, $TiO_x$, $CuO_x$, $ZrO_x$, $TaO_x$, $AlO_x$, CoO, $HfO_x$, ZnO, $InZnO_x$, Si and organic materials. In the present embodiment, the diode 10 having the unidirectional conducting rectification characteristic is the Schottky diode. The functional layer 102 of the Schottky diode is formed by $CuO_x$.

The upper electrode 203, the intermediate electrode 30 and the lower electrode 101 each consist of at least one of the following materials: Pt, Ag, Pd, W, Ti, Al, Cu, TiN, ITO, IZO, YBCO, $LaAlO_3$, $SrRuO_3$ and polycrystalline silicon. In the present embodiment, the lower electrode 101 is formed by $n^+$ doped Si. The intermediate electrode 30 is formed by Pt. The upper electrode 203 is formed by Ag. The variable-resistance storage layer 202 is formed by at least one of the following materials or the material formed by doping and modifying at least one of the following materials: NiO, $TiO_x$, $CuO_x$, $ZrO_x$, $TaO_x$, $AlO_x$, CoO, $HfO_x$, $MoO_x$, ZnO, PCMO, LCMO, $SrTiO_3$, $BaTiO_3$, $SrZrO_3$, amorphous silicon and organic materials. In the present embodiment, the variable-resistance storage layer 202 is formed by $ZrO_2$.

Figure 4:
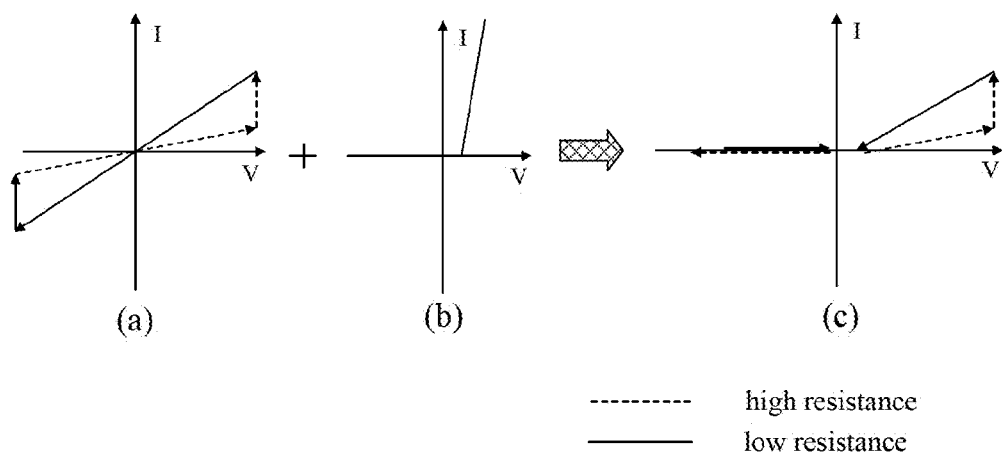
FIG. 4 is the diagram of the current and voltage characteristics of the one time programming memory of the present invention.

FIG. 4 is an operation diagram of the one time programming memory of the present invention. As illustrated in FIG. 4(a), the resistance value of the bipolar variable-resistance memory is converted from the high resistance to the low resistance at a voltage polarity. Besides, only at another voltage polarity, the resistance is converted from the low resistance to the high resistance. What is illustrated in FIG. 4(b) is a diagram of a common unidirectional conducting diode characteristic. The bipolar variable-resistance memory having the characteristic shown in FIG. 4(a) and the diode having the characteristic shown in FIG. 4(b) are connected in series to form the one time programming memory device of the present invention. As illustrated in 4(c), the variable-resistance memory having the bipolar conversion characteristic is in the high resistance state at the beginning and the variable-resistance memory having the bipolar conversion characteristic is converted from the high resistance state to the low resistance state to realize one time programming when a sufficiently high positive voltage is applied. In the negative voltage direction, because of rectification function of the diode having the unidirectional conducting rectification characteristic, the conversion process of the variable-resistance memory having the bipolar conversion characteristic from the low resistance state to the high resistance state is inhibited. Therefore, the variable-resistance memory having the bipolar conversion characteristic is always maintained in the low resistance state. Because of the function of the diode having the rectification characteristic, the one time programming memory has the rectification function in the low resistance state.

Figure 5:
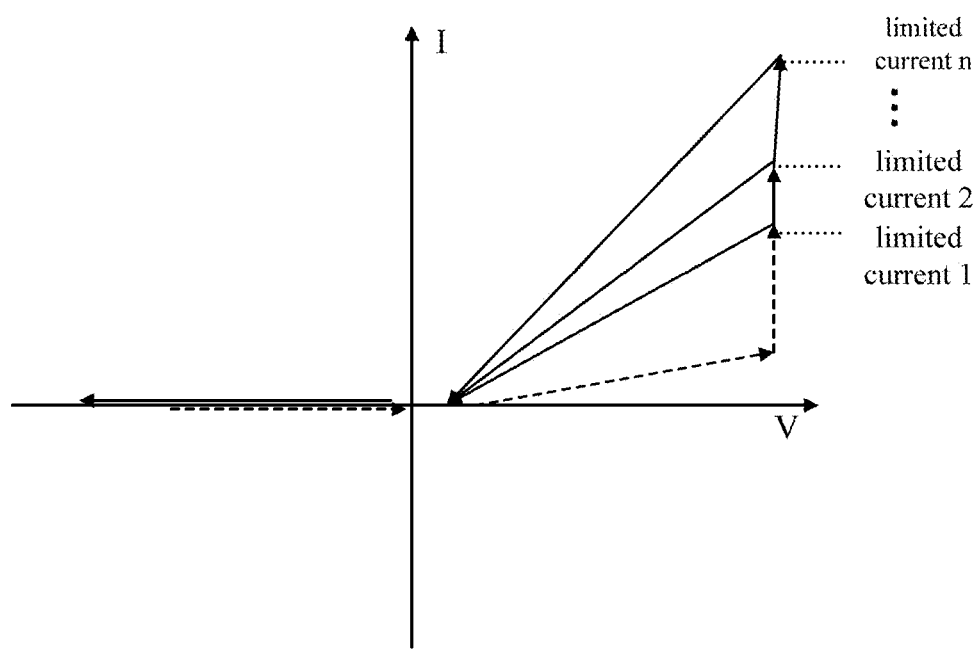
FIG. 5 is a multilevel storage diagram of the one time programming memory of the present invention.

FIG. 5 is a multilevel storage diagram of the one time programming memory of the present invention. As illustrated in FIG. 5, in the aforesaid process, the variable-resistance memory having the bipolar conversion characteristic in the primary state is the high resistance. By applying different programming currents (limited current 1, limited current 2 . . . limited current n) or different programming voltages, the variable-resistance memory can be programmed into the different low resistance states so as to carry out the multilevel storage. The direction of the programming current or the polarity of the programming voltage is consistent with the positive current direction or the positive voltage polarity of the diode.

Figure 6:
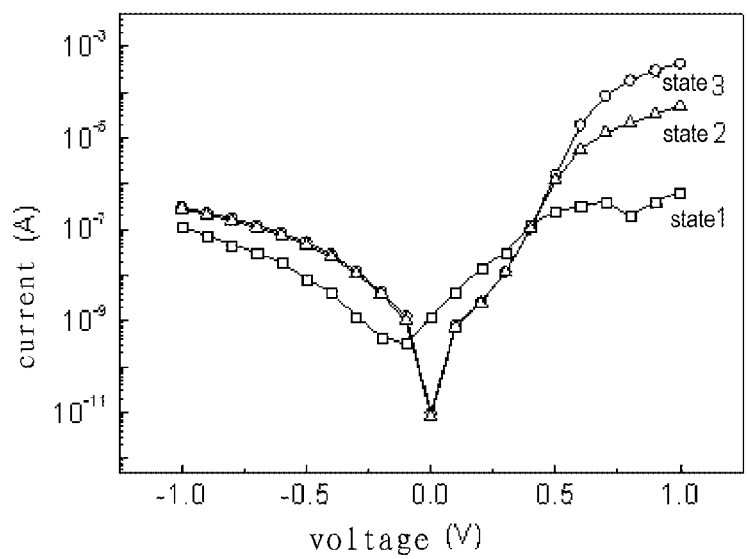
FIG. 6 is a current-voltage characteristic graph of the one time programming memory of the present invention.

FIG. 6 is a current-voltage characteristic graph of the one time programming memory of the present invention. What is illustrated in FIG. 6 is the current-voltage characteristic graph obtained from the one time programming memory formed by $Ag/ZrO_2/Pt/CuO_x/n^+$ Si tested in the direct current scan mode. The one time programming memory is in the high resistance state "0" at the beginning. After the bias voltage is applied, the one time programming memory device is converted from the high resistance state "0" to the low resistance state "1" so as to realize one time programming. When the reversed voltage is used for scan, the resistance conversion in the negative direction can't be achieved because of the function of the diode having the unidirectional conducting rectification characteristic. In the programming process, when the storage is not programmed, the one time programming memory is in the state 1. When the current of the one time programming memory is not limited, the one time programming memory can be programmed into the state 3. When the limited current is 10 mA, the one time memory can be programmed into the state 2. After being programmed, the one time programming memory device is at the readout voltage ±1 V. The ratios of positive current to the negative current of the different low resistance states (state 2 and state 3) are about $10^2$ and $10^3$. This can effectively inhibit the read crosstalk in the cross-array structure to avoid occurrence of misreading.

Figure 7:
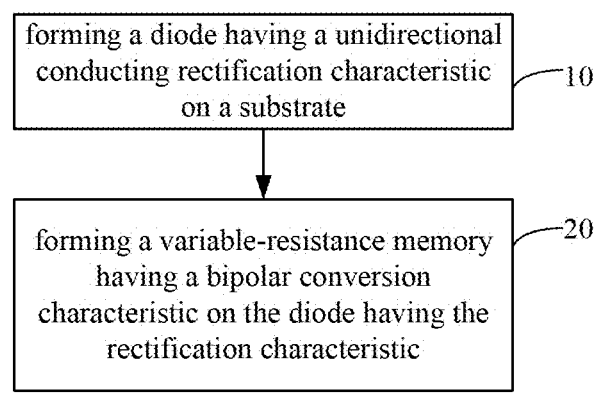
FIG. 7 is a flow chart of a manufacture method of the one time programming memory of the present invention.

FIG. 7 is a manufacture method flow chart of the one time programming memory of the present invention. As illustrated in FIG. 7, the manufacture method comprises the following steps:

step 10: forming the diode 10 having the unidirectional conducting rectification characteristic on a substrate.

The step 10 comprises the following steps: firstly, forming a lower electrode 101 on the substrate; forming a diode functional layer 102 on the lower electrode 101; then, forming an intermediate electrode 30 on the diode functional layer 102.

The lower electrode 101 and the intermediate electrode 30 are formed by physical vapor deposition and chemical vapor deposition. The physical vapor deposition comprises electron beam evaporation, thermal evaporation or sputter. The diode functional layer 102 is formed by electron beam evaporation, sputter, plasma enhanced chemical vapor deposition, spinning or atomic layer deposition.

Step 20: forming the variable-resistance memory 20 having the bipolar conversion characteristic on the diode 10 having the unidirectional conducting rectification characteristic.

The step 20 comprises the following steps: first, forming the variable-resistance storage layer 202 on the intermediate electrode 30; then, forming the upper electrode 203 on the variable-resistance storage layer 202.

The upper electrode 203 is formed by the physical vapor deposition and the chemical vapor deposition. The physical vapor deposition comprises electron beam evaporation, thermal evaporation or sputter. The variable-resistance storage layer 202 is formed by electron beam evaporation, sputter, plasma enhanced chemical vapor deposition, spinning or atomic layer deposition.

According to the aforesaid contents, it can be learned that in the embodiment of the present invention, via manufacture of a one time programming memory device, by connecting the unidirectional conducting rectification diode in series, the resistance of the variable-resistance memory having the bipolar conversion characteristic only changes once to carry out one time programming Different programming voltages or different programming currents are used to program the one time programming memory into different low resistance states to carry out the multilevel storage. By rectification characteristic of the diode, the read crosstalk in the cross-array structure can be effectively inhibited so as to integrate the storage device with the external circuits. It simplifies the manufacture process and reduces the cost.

Although the relevant embodiments and the advantages have been explained in detail, the aforesaid ones are the better embodiments of the present invention. They are not used to limit the present invention. It shall be understood that these embodiments can be changed, replaced and modified in various manners without deviation of the spirit of the present invention and the scope of protection of the attached claims. As for other embodiments, those skilled in the art should easily understand that the sequence of the process steps can be changed when the scope of protection of the present invention is maintained.

In addition, the application scope of the present invention is not only limited to process, manufacture, composition, means, methods and steps of the special embodiments described in the Description. According to the disclosure of the present invention, those skilled in the art will easily understand that as for the existent or the subsequently developed process, manufacture, composition, means, methods and steps, which carry out the function or obtain the results approximately identical with the corresponding embodiments described in the present invention, they can be applied according to the present invention. Thus, the claims attached in the present invention aim to include these process, structures, manufacture, composition, means, methods or steps in its scope of protection.

The invention claimed is:

1. A one time programming memory, characterized in: the one time programming memory comprises a diode (10) having a unidirectional conducting rectification characteristic and a variable-resistance memory (20) having a bipolar conversion characteristic; the rectification diode (10) having the unidirectional conducting characteristic and the variable-resistance memory (20) having the bipolar conversion characteristic are connected in series; the rectification diode (10) enables the bipolar variable-resistance memory (20) to carry out one time programming via the unidirectional conducting characteristic; and, the bipolar variable-resistance memory (20) carries out one time programming in different states via different voltages or currents, wherein the rectification function of the diode (10) having the unidirectional conducting rectification characteristic causes the resistance of the variable-resistance memory (20) having the bipolar conversion characteristic not to vary at the voltage or current of opposite polar in order to be always in a low resistance state to carry out one time programming.

2. The one time programming memory according to claim 1, characterized in: the diode (10) having the unidirectional conducting rectification characteristic comprises a lower electrode (101), a diode functional layer (102) and an intermediate electrode (30); the diode functional layer (102) is located between the intermediate electrode (30) and the lower electrode (101); the diode (10) having the rectification characteristic is a Schottky or PN junction diode.

3. The one time programming memory according to claim 2, characterized in: the functional layer (102) of the diode (10) that is a Schottky diode is formed by at least one of the following materials or the material formed by doping and modifying at least one of the following materials: NiO, $TiO_x$, $CuO_x$, $ZrO_x$, $TaO_x$, $AlO_x$, CoO, $HfO_x$, ZnO, Si and organic materials.

4. The one time programming memory according to claim 2, characterized in: P-type and N-type material layers in the functional layer (102) of the diode (10) that is a PN junction diode are formed by at least one of the following materials or the material formed by doping and modifying at least one of the following materials: NiO, $TiO_x$, $CuO_x$, $ZrO_x$, $TaO_x$, $AlO_x$, CoO, $HfO_x$, ZnO, $InZnO_x$, Si and organic materials.

5. The one time programming memory according to claim 1, characterized in: the variable-resistance memory (20) having the bipolar conversion characteristic comprises an intermediate electrode (30), a variable-resistance storage layer (202) and an upper electrode (203); the variable-resistance storage layer (202) is located between the upper electrode (203) and the intermediate electrode (30).

6. The one time programming memory according to claim 5, characterized in: the upper electrode (203), the intermediate electrode (30) and the lower electrode (101) are formed by at least one of the following materials: Pt, Ag, Pd, W, Ti, Al, Cu, TiN, ITO, IZO, YBCO, $LaAlO_3$, $SrRuO_3$ and polycrystalline silicon.

7. The one time programming memory according to claim 5, characterized in: the variable-resistance storage layer (202) is formed by at least one of the following materials or the material formed by doping and modifying at least one of the following materials NiO, $TiO_x$, $CuO_x$, $ZrO_x$, $TaO_x$, $AlO_x$, CoO, $HfO_x$, $MoO_x$, ZnO, PCMO, LCMO, $SrTiO_3$, $BaTiO_3$, $SrZrO_3$, amorphous silicon and organic materials.

8. A storage method of a one time programming memory, characterized in: the one time programming memory comprises a diode (10) having a unidirectional conducting rectification characteristic and a variable-resistance memory (20) having a bipolar conversion characteristic; the rectification diode (10) having the unidirectional conducting characteristic and the variable-resistance memory (20) having the bipolar conversion characteristic are connected in series; the storage method includes:

applying a suitable programming voltage or programming current so that the variable-resistance memory (20) having bipolar conversion characteristic of which the primary state is in high resistance is converted from high resistance to low resistance; and, by means of the rectification function of the diode (10) having the unidirectional conducting rectification characteristic, causing the resistance of the variable-resistance memory (20) having the bipolar conversion characteristic not to vary at the voltage of opposite polar in order to be always in a low resistance state to carry out one time programming.

9. The storage method of the one time programming memory according to 8, characterized in, further including: setting different programming voltages and programming currents so that the variable-resistance memory (20) having the bipolar conversion characteristic is programmed into different resistance states so as to carry out multilevel storage.

10. The storage method of the one time programming memory according to 8, characterized in, when the one programming variable-resistance memory is in a low resistance state, read crosstalk is inhibit via the rectification function of the diode (10) having the unidirectional conducting rectification characteristic so as to avoid occurrence of misreading.

11. A manufacture method of a one time programming memory, characterized in, the manufacture method comprises the following steps:

step 10: forming a diode (10) having a unidirectional conducting rectification characteristic on a substrate;

step 20: forming a variable-resistance memory (20) having a bipolar conversion characteristic on the diode (10) having the unidirectional conducting rectification characteristic, wherein the rectification function of the diode (10) having the unidirectional conducting rectification characteristic causes the resistance of the variable-resistance memory (20) having the bipolar conversion characteristic not to vary at the voltage or current of opposite polar in order to be always in a low resistance state to carry out one time programming.

12. The manufacture method of the one time programming memory according to claim 11, characterized in, the step 10 further comprising the following steps:

step 101: forming a lower electrode (101) on the substrate;

step 102: forming a diode functional layer (102) on the lower electrode (101);

step 103: forming an intermediate electrode (30) on the diode functional layer (102).

13. The manufacture method of the one time programming memory according to claim 12, characterized in, the step 20 further comprises the following steps:

step 202: forming a variable-resistance storage layer (202) on the intermediate electrode (30);

step 203: forming an upper electrode (203) on the variable-resistance storage layer (202).

* * * * *